United States Patent
Neal et al.

(10) Patent No.: US 8,404,047 B2
(45) Date of Patent: Mar. 26, 2013

(54) ELECTRON BEAM VAPOR DEPOSITION APPARATUS AND METHOD

(75) Inventors: James W. Neal, Ellington, CT (US); Michael J. Maloney, Marlborough, CT (US); David A. Litton, Rocky Hill, CT (US); Christopher Masucci, Conventry, CT (US)

(73) Assignee: United Technologies Corporation, Hartford, CT (US)

( * ) Notice: Subject to any disclaimer, the term of this patent is extended or adjusted under 35 U.S.C. 154(b) by 1190 days.

(21) Appl. No.: 12/211,404

(22) Filed: Sep. 16, 2008

(65) Prior Publication Data

US 2010/0068417 A1    Mar. 18, 2010

(51) Int. Cl.
    *C23C 16/00*    (2006.01)
(52) U.S. Cl. .................... 118/719; 118/718; 118/726
(58) Field of Classification Search ............ 118/718, 118/719, 726
    See application file for complete search history.

(56) References Cited

U.S. PATENT DOCUMENTS

| | | | |
|---|---|---|---|
| 3,656,454 A * | 4/1972 | Schrader ................. | 118/724 |
| 4,351,267 A | 9/1982 | Kalbskopf | |
| 4,816,293 A | 3/1989 | Hiramoto | |
| 5,534,314 A | 7/1996 | Wadley | |
| 5,562,800 A * | 10/1996 | Kawamura et al. ........... | 414/806 |
| 6,177,200 B1 | 1/2001 | Maloney | |
| 6,255,001 B1 | 7/2001 | Darolia | |
| 6,284,323 B1 | 9/2001 | Maloney | |
| 6,447,854 B1 | 9/2002 | Rigney | |
| 6,482,537 B1 | 11/2002 | Strangman | |
| 7,576,017 B2 * | 8/2009 | Tuttle .................... | 438/800 |
| 2005/0000444 A1 * | 1/2005 | Hass et al. ................. | 118/723 EB |
| 2005/0255242 A1 | 11/2005 | Hass | |
| 2006/0062912 A1 | 3/2006 | Wortman | |
| 2007/0172703 A1 | 7/2007 | Freling | |
| 2007/0207266 A1 | 9/2007 | Lemke | |

FOREIGN PATENT DOCUMENTS

| | | |
|---|---|---|
| EP | 0969117 A2 | 1/2000 |
| EP | 1621647 A2 | 2/2006 |
| JP | 06002137 A | 1/1994 |
| JP | 2006045674 | 2/2006 |
| JP | 2007192219 | 8/2007 |
| WO | 03/028428 | 4/2003 |
| WO | 2004/011688 | 2/2004 |
| WO | 2004/048632 | 6/2004 |
| WO | 2007005832 | 1/2007 |

OTHER PUBLICATIONS

Hass D D et al: "Electron Beam Directed Vapor Deposition of Thermal Barrier Coatings" Journal of Vacuum Science and Technology: Part A, vol. 16, No. 6, Nov. 1, 1998, pp. 3396-3401, XP012004300 AVS/AIP, Melville, NY [US], ISSN: 0734-2101.
European Search Report mailed on Dec. 21, 2009 for EP 09252199.

* cited by examiner

*Primary Examiner* — Karla Moore
(74) *Attorney, Agent, or Firm* — Carlson, Gaskey & Olds PC

(57) ABSTRACT

An electron beam vapor deposition apparatus includes a coating chamber having a first chamber section with a first coating zone for depositing a first coating and a second chamber section with a second coating zone for depositing a second coating. At least one electron beam source is associated with the first chamber section and the second chamber section. A first crucible is adjacent to the first coating zone for presenting a first source coating material, and a second crucible is adjacent to the second coating zone for presenting a second source coating material. A transport is operative to move a work piece between the first coating zone of the first chamber section and the second coating zone of the second chamber section.

17 Claims, 2 Drawing Sheets

ELECTRON BEAM VAPOR DEPOSITION APPARATUS AND METHOD

BACKGROUND OF THE INVENTION

This disclosure relates to coating equipment and, more particularly, to a coating apparatus and method that facilitate depositing a coating on a substrate.

Physical vapor deposition ("PVD") is one common method for coating a substrate, such as a metallic coating or a ceramic coating on gas turbine engine airfoils. For instance, the coating may be a protective coating or a coating for promoting adhesion. One type of PVD process utilizes an electron beam gun to melt and vaporize a source material contained within a crucible. The vaporized source material condenses and deposits onto the substrate as the coating. Although generally effective, angled surfaces and non-line-of-sight surfaces relative to the crucible may not be uniformly coated or may be poorly coated. Moreover, improvements to existing PVD equipment for efficiently and cost-effectively forming multi-layer coatings are desirable.

SUMMARY OF THE INVENTION

An example electron beam vapor deposition apparatus includes a coating chamber having a first chamber section with a first coating zone for depositing a first coating and a second chamber section with a second coating zone for depositing a second coating. At least one electron beam source is associated with the first chamber section and the second chamber section. A first crucible is adjacent to the first coating zone for presenting a first source coating material, and a second crucible is adjacent to the second coating zone for presenting a second source coating material. A transport is operative to move a work piece between the first coating zone of the first chamber section and the second coating zone of the second chamber section.

In another aspect, an electron beam vapor deposition apparatus includes a coating chamber having a pair of first chamber sections and a second chamber section. Each of the pair of first chamber sections includes a first coating zone for depositing a first coating. The second chamber section includes a second coating zone for depositing a second coating. At least one electron beam is associated with the pair of first chamber sections and the second chamber section. Respective ones of a plurality of first crucibles are adjacent to respective ones of the pair of first coating zones for presenting first source coating materials. At least one second crucible is adjacent to the second coating zone for presenting a second source coating material. At least one first transport is operative to move a work piece between one of the pair of first chamber sections and the second chamber section. At least one second transport is operative to move another work piece between the other of the pair of first chamber sections and the second chamber section.

An example coating method for use with an electron beam vapor deposition apparatus includes vaporizing a first coating source material and depositing the vaporized first source coating material as a first coating on a work piece in a first coating zone of a first coating chamber section of a coating chamber. The work piece is moved into a second coating zone of a second chamber section of the coating chamber. A second source coating material is vaporized and the vaporized second source coating material is deposited as a second coating on the work piece in the second coating zone of the second chamber section.

BRIEF DESCRIPTION OF THE DRAWINGS

The various features and advantages of the disclosed examples will become apparent to those skilled in the art from the following detailed description. The drawings that accompany the detailed description can be briefly described as follows.

DETAILED DESCRIPTION OF THE PREFERRED EMBODIMENT

Figure 1:
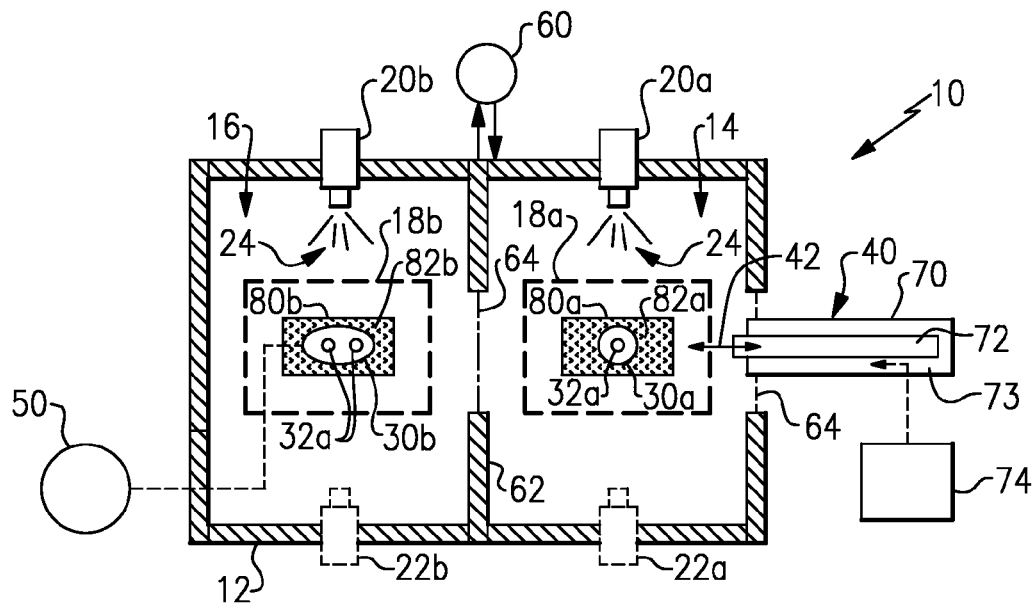
FIG. 1 illustrates an example electron beam vapor deposition apparatus.

FIG. 1 illustrates selected portions of an example electron beam vapor deposition ("EBVD") apparatus 10 for depositing a single layer coating or multi-layer coating on one or more work pieces. As an example, the work pieces may be gas turbine engine airfoils, such as turbine blades or vanes. The coating may be a metallic coating, a ceramic coating, or other type of coating suited for vapor deposition. For instance, the coating may be hafnium based or zirconia based, e.g., including gadolinia, zirconia, yttria, or combinations thereof. For instance, the coating may include at least one of yttria stabilized zirconia ("YSZ") or gadolinia stabilized zirconia ("GSZ"). The coating may include multiple layers of either YSZ or GSZ, or layers of both YSZ and GSZ in a multi-layer coating. For instance, the coating may include a layer of a low dopant level zirconate or hafnate, a layer of a high dopant level zirconate or hafnate, and another layer of a low dopant level zirconate or hafnate.

As will be discussed, the EBVD apparatus 10 facilitates depositing the coating on one or more work pieces. For instance, the EBVD apparatus 10 may facilitate depositing the coating on angled surfaces and non-line-of-sight surfaces of a work piece and/or may be used to deposit a multi-layer coating with layers of similar or different compositions.

In the illustrated example, the EBVD apparatus 10 includes a coating chamber 12 having a first chamber section 14 and a second chamber section 16. The first chamber section includes a first coating zone 18a and the second chamber section 16 includes a second coating zone 18b. For instance, the first coating zone 18a and the second coating zone 18b include a spatial volume within the coating chamber 12 where one or more work pieces may be coated.

A first electron beam source 20a is associated with the first chamber section 14, and a second electron beam source 20b is associated with the second chamber section 16. For instance, the first electron beam source 20a and the second electron beam source 20b may be mounted using known techniques to the walls of the coating chamber 12 or mounted adjacent to the walls.

Optionally, the first chamber section 14 may include an additional first electron beam source 22a, and the second chamber section 16 may include an additional second electron beam source 22b. The first electron beam sources 20a and 22a and the second electron beam sources 20b and 22b are operative to emit electron beams 24 in directions toward the respective first coating zone 18a and second coating zone 18b to coat the work piece(s).

A first crucible 30a is adjacent to the first coating zone 18a for presenting a first source coating material 32a, and a second crucible 30b is adjacent to the second coating zone 18b for presenting a second source coating material 32b. As an example, the first source coating material 32a and the second source coating material 32b may be ingots of metallic or ceramic material as described above that will later be melted and evaporated using the electron beams 24 to coat the work piece.

A transport 40 is operative to move back and forth along direction 42 between the first chamber section 14 and the second chamber section 16. The transport 40 serves to move the work piece(s) between the first coating zone 18a and the second coating zone 18b. For example, one or more work pieces may be mounted to the transport 40 and manually or automatically moved between the first chamber section 14 and the second chamber section 16.

The example EBVD apparatus 10 may be used to deposit a multi-layered coating and/or deposit coatings on all surfaces of a work piece(s), including angled surfaces and non-line-of-sight surfaces. For example, the transport 40 may move a work piece into the second coating zone 18b of the second chamber section 16. The coating chamber 12 may be evacuated to a predetermined pressure before the coating process begins. The second electron beam source 20b may then be activated to melt and vaporize the second source coating material 32b. The vaporized second coating source material deposits onto the work piece as a coating layer.

The transport 40 may then move the work piece into the first coating zone 18a of the first chamber section 14. The first electron beam source 20a may then be activated to melt and vaporize the first source coating material 32a and deposit another coating layer on the work piece(s). Thus, the EBVD apparatus 10 provides the benefit of depositing a multi-layered coating on the work piece(s). Moreover, the coating layers may be of the same composition or a different composition, depending on the compositions of the first source coating material 32a and the second source coating material 32b.

In the illustrated example, the EBVD apparatus 10 may also be used to coat angled surfaces and non-line-of-sight surfaces of the work piece(s). For instance, the second chamber section 16 may be adapted for directed vapor deposition using a carrier gas 51 (FIG. 2) and the first chamber section 14 may be adapted for physical vapor deposition. That is, the second chamber section 16 may be used to deposit a coating layer on angled surfaces and non-line-of-sight surfaces and the first chamber section 14 may be used to deposit another coating layer on the remaining surfaces (e.g., line-of-sight surfaces).

Figure 2:
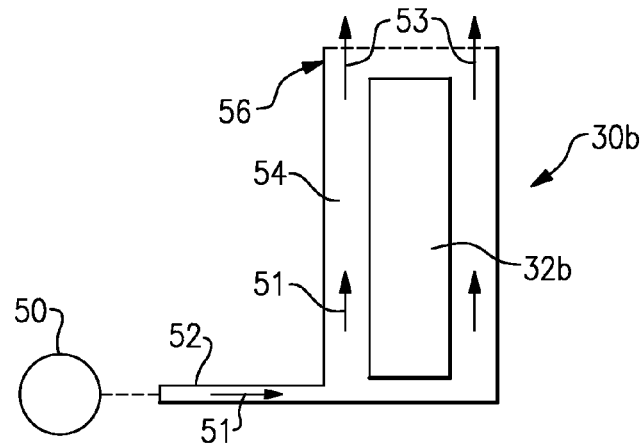
FIG. 2 illustrates an example crucible for directed vapor deposition.

The second crucible 30b may be adapted for directed vapor deposition by being fluidly connected with a gas source 50 for providing the carrier gas 51. FIG. 2 illustrates an example of the second crucible 30b, which may include an inlet 52 fluidly coupled to the gas source 50. For instance, the inlet may be a fitting or connector. The inlet 52 is fluidly connected with a gas flow passage 54 that is exposed to the second source coating material 32b. The gas flow passage 54 extends to a nozzle section 56 that emits a coating stream 53 of vaporized second source coating material 32b entrained in the carrier gas 51. That is, as the electron beams 24 vaporize the second source coating material 32b, the vaporized second coating source material becomes entrained in the carrier gas 51 flowing through the gas flow passage 54. The coating stream 53 flows from the nozzle section 56 toward the work pieces within the second coating zone 18b.

The second crucible 30b may be aimed toward particular locations on a work piece that are difficult to coat using conventional physical vapor deposition, which is a line-of-sight process. In this regard, the second crucible 30b may be positioned an appropriate stand-off distance (e.g., vertical distance) from the second coating zone 18b to facilitate the directed vapor deposition. The stand-off distance is a function of the design of the second crucible 30b and the geometry of the work pieces being coated. For example, the stand-off distance may be less than a stand-off distance between the first crucible 30a and the first coating zone 18a used for physical vapor deposition. In one example, the stand-off distance of the second crucible 30b is about six to eight inches (about 15.2 to 20.3 centimeters) and the stand-off distance of the first crucible 30a is about twelve to fourteen inches (about 30.5 to 35.6 centimeters). The shorter stand-off distance of the second crucible 30b provides the benefit of accurately aiming the coating stream 53.

In one example, the coating stream 53 may be directed between paired airfoils that are connected to a common platform, where the airfoils may only be fractions of an inch apart. The coating stream 53 may carry the entrained second source coating material 32b between the paired airfoils to coat non-line-of-sight surfaces and portions of the common platform that may otherwise be difficult to coat.

The second crucible 30b and second chamber section 16 may be used to coat only the angled surfaces and/or non-line-of-sight surfaces of one or more work pieces. The transport 40 may then retract into the first chamber section 14 to deposit a coating generally over the other surfaces of the work piece(s). In this example, the first crucible 30a may be adapted for physical vapor deposition, wherein the first crucible 30a only contains the first source coating material 32a and is not connected to a gas source. The first electron beam source 20a may be activated to melt and vaporize the first source coating material 32a to deposit a coating layer on the remaining surfaces of the work piece(s). In this manner, the work piece may be completely coated using the directed vapor deposition process within the second chamber section 16 and the physical vapor deposition process within the first chamber section 14. Additionally, coating a work piece according to the given example may also reduce expenses by limiting the use of the somewhat more expensive directed vapor deposition process. In general, the carrier gas 51 and the second crucible 30b (which may be designed for a particular work piece) may add expense to the directed vapor deposition compared to the physical vapor deposition process.

In the above examples, the coating chamber 12 may also include a cooling device 60 for circulating a coolant through the walls of the coating chamber 12 to maintain the coating chamber 12 at a desired temperature.

The coating chamber 12 may also include one or more baffles 62 separating the first chamber section 14 from the second chamber section 16. The baffle 62 may include a valve 64, such as a gate valve for providing a gas tight seal between the first chamber section 14 and the second chamber section 16. The valve 64 enables different pressures to be used in the first chamber section 14 and the second chamber section 16 for a given coating process.

Transport 40 may be any type of mechanical device for moving one or more work pieces between the first chamber section 14 and the second chamber section 16. In one example, the transport 40 includes a static outer shaft 70 and a movable drive shaft 72 arranged concentrically within the static outer shaft 70. For example, the movable drive shaft 72 may be extended and retracted between the first chamber section 14 and the second chamber section 16 for a given coating process. The static outer shaft 70 may also be used to support other devices for facilitating the coating process, such as a thermal hood disclosed in Ser. No. 12/196,368.

Optionally, the static outer shaft 70 may be radially spaced apart from the moveable drive shaft 72 such that there is a gas flow passage 73 there between. The gas flow passage 73 opens to the interior of the coating chamber 12 and may be fluidly connected with another gas source 74, such as an oxygen gas source. The gas from the gas source 74 may be used for a preheating cycle to oxidize the surfaces of the work piece(s) in preparation for the coating process.

To preheat the work piece(s), the first chamber section 14 may include a water cooled tray 80*a* containing a first media 82*a*. Likewise, the second chamber section 16 may include a second water cooled tray 80*b* containing a second media 82*b*. In this example, the electron beams 24 may be used to heat the media 82*a* or 82*b* and thereby radiantly heat the work pieces suspended over the water cooled trays 80*a* and 80*b*. For example, the additional first electron beam source 22*a* and second electron beam source 22*b* may be used for the preheating, and the first electron beam source 20*a* and second electron beam source 20*b* may be used for melting and vaporizing, respectively, the first source coating material 32*a* and second source coating material 32*b*.

Figure 3:
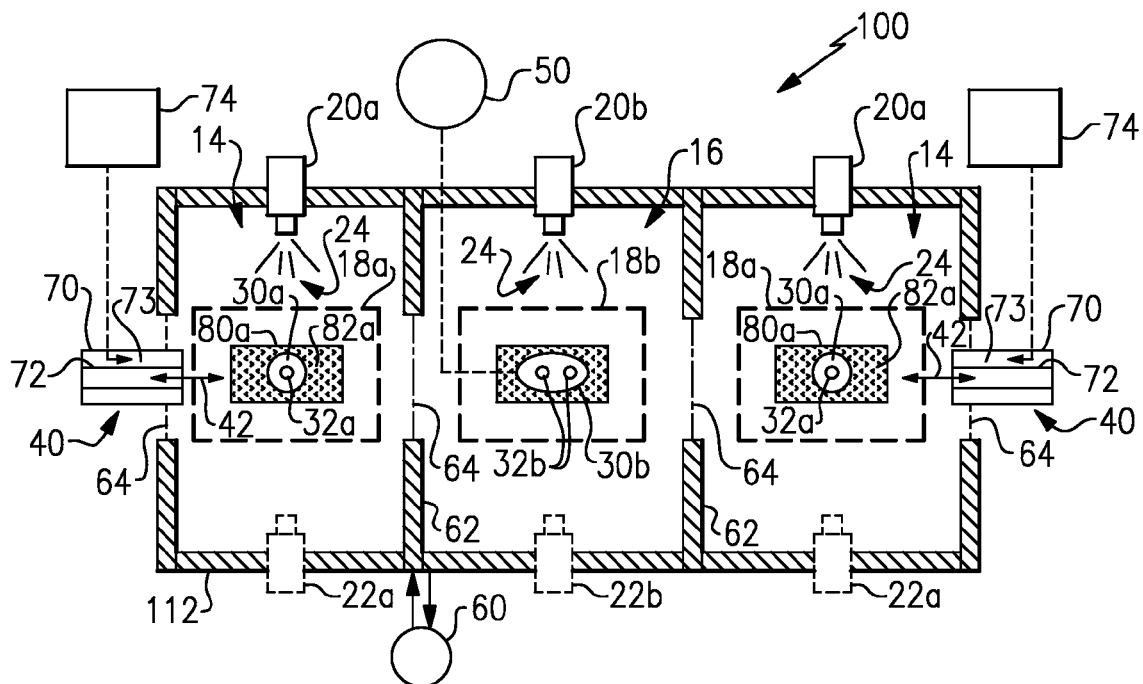
FIG. 3 illustrates another example electron beam vapor deposition apparatus.

FIG. 3 illustrates another EBVD apparatus 100 that is somewhat similar to the EBVD apparatus 10 of the previous examples. In this disclosure, like reference numerals designate like elements where appropriate, and reference numerals with the addition of one-hundred or multiples thereof designate modified elements. The modified elements incorporate the same features and benefits of the corresponding modified elements, except where stated otherwise. In this example, a coating chamber 112 includes a pair of the first chamber sections 14. The second chamber section 16 may be located between the pair of first chamber sections 14. Additionally, another transport 40 may be used in conjunction with the added first chamber section 14.

The EBVD apparatus 100 may be used to relatively efficiently deposit coatings. For instance, the right-side transport 40 may be used to move a first work piece or set of work pieces into the second chamber section 16 for depositing a coating layer on those work pieces. After depositing the coating layer, the right-side transport 40 may move the work pieces into the right-side first chamber section 14 to deposit another coating layer on those work pieces. The left-side transport 40 may then move another work piece or set of work pieces into the second chamber section 16, which may be sealed from the right-side first chamber section 14 using the valve 64. After depositing the coating layer, the left-side transport 40 may move the work pieces into the left-side first chamber section 14 to deposit another coating layer on those work pieces. Thus, the second chamber section 16 may serve the pair of first chamber sections 14.

In a further example, a coating cycle time used for the second chamber section 16 may be less than a coating cycle time of each of the pair of first chamber sections 14. Therefore, using the single second chamber section 16 to serve multiple first chamber sections 14 reduces the down time of the second chamber section 16, which may reduce the overall operating expense. Thus, the EBVD apparatus 100 may be used to deposit coatings on different work pieces in a relatively high productivity and cost effective process. Additionally, pre-heating chambers may be used in combination with any of the first chamber sections 14 of the disclosed examples to pre-heat the work pieces prior to insertion into the first chamber sections 14 or in addition to heating within the first chamber sections 14.

Figure 4:
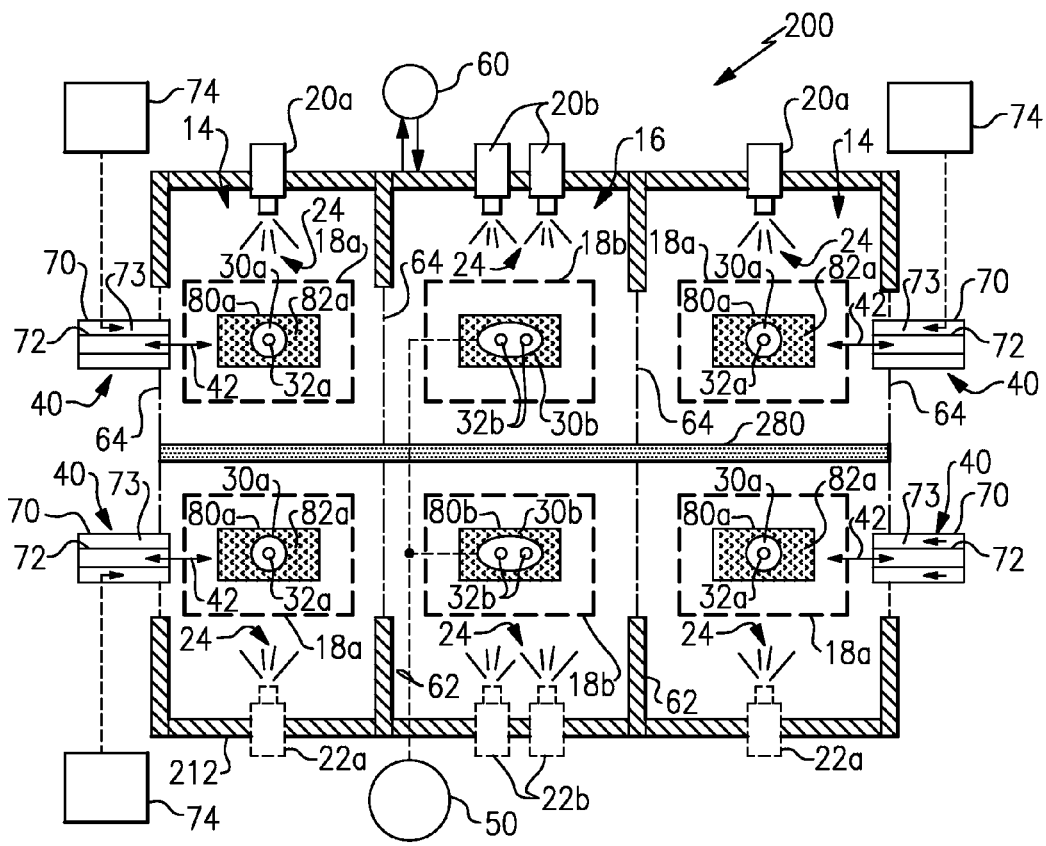
FIG. 4 illustrates another example electron beam vapor deposition apparatus.

FIG. 4 illustrates another example EBVD apparatus 200 that is somewhat similar to the EBVD apparatus 100 of the previous example. In this example, the EBVD apparatus 200 also includes a pair of first chamber sections 14 located on opposed sides of the second chamber section 16. However, each of the pair of first chamber sections 14 includes multiple coating zones 18*a*, and the second chamber section 16 includes multiple second coating zones 18*b*. The EBVD apparatus 100 also includes two additional transports 40 to move work pieces between the additional first coating zones 18*a* and second coating zones 18*b*.

The EBVD apparatus 100 may also include a divider wall 280 to at least partially separate a portion of the first coating zones 18*a* and second coating zones 18*b*. For instance, the divider wall 280 may extend between the first coating zones 18*a* in each of the first chamber sections 14 and the second coating zones 18*b* in the second chamber section 16. The divider wall 280 provides the benefit of physically separating the coating zones to facilitate thermal management and deposition effectiveness.

Although a combination of features is shown in the illustrated examples, not all of them need to be combined to realize the benefits of various embodiments of this disclosure. In other words, a system designed according to an embodiment of this disclosure will not necessarily include all of the features shown in any one of the Figures or all of the portions schematically shown in the Figures. Moreover, selected features of one example embodiment may be combined with selected features of other example embodiments.

The preceding description is exemplary rather than limiting in nature. Variations and modifications to the disclosed examples may become apparent to those skilled in the art that do not necessarily depart from the essence of this disclosure. The scope of legal protection given to this disclosure can only be determined by studying the following claims.

What is claimed is:

1. An electron beam vapor deposition apparatus comprising:
   a coating chamber including a first chamber section having a first coating zone for depositing a first coating layer and a second chamber section having a second coating zone for depositing a second coating layer;
   at least one electron beam source associated with the first chamber section and the second chamber section;
   a first crucible adjacent the first coating zone for presenting a first source coating material;
   a second crucible adjacent the second coating zone for presenting a second source coating material;
   a transport for moving a work piece between the first coating zone of the first chamber section and the second coating zone of the second chamber section, the transport including a passage between a static outer shaft and a moveable drive shaft at least partially within the static outer shaft, the passage opening to an interior of the coating chamber; and
   a gas source fluidly connected with the passage.

2. The electron beam vapor deposition apparatus as recited in claim 1, wherein the coating chamber includes at least one baffle separating the first chamber section and the second chamber section.

3. The electron beam vapor deposition apparatus as recited in claim 1, wherein the coating chamber includes a valve between the first chamber section and the second chamber section.

4. The electron beam vapor deposition apparatus as recited in claim 3, wherein the valve is a gate valve.

5. The electron beam vapor deposition apparatus as recited in claim 1, further comprising a gas source fluidly connected with the second crucible.

6. The electron beam vapor deposition apparatus as recited in claim 5, wherein the second crucible includes an internal gas flow passage for conveying gas from the gas source.

7. The electron beam vapor deposition apparatus as recited in claim 1, further comprising a first stand-off distance between the first crucible and the first coating zone, and a second stand-off distance between the second crucible and the second coating zone, wherein the second stand-off distance is less than the first stand-off distance.

8. The electron beam vapor deposition apparatus as recited in claim 1, wherein the first crucible is adapted for physical vapor deposition and the second crucible is adapted for directed vapor deposition by way of a carrier gas.

9. The electron beam vapor deposition apparatus as recited in claim 1, wherein the gas source is outside of the coating chamber.

10. An electron beam vapor deposition apparatus comprising:
- a coating chamber including a pair of first chamber sections and a second chamber section, each of the pair of first chamber sections having a first coating zone for depositing a first coating, the second chamber section having a second coating zone for depositing a second coating;
- at least one electron beam source associated with the pair of first chamber sections and the second chamber section;
- a plurality of first crucibles, with respective ones of the plurality of first crucibles being adjacent to respective ones of the pair of first coating zones for presenting first source coating materials;
- at least one second crucible adjacent to the second coating zone for presenting a second source coating material;
- at least one first transport operative to move at least one work piece between one of the pair of first chamber sections and the second chamber section;
- at least one second transport operative to move at least one other work piece between the other of the pair of first chamber sections and the second chamber section; and
- a gas source, wherein the at least one first transport and the at least one second transport each include a passage between a static outer shaft and a moveable drive shaft at least partially within the static outer shaft, the passage opening to an interior of the coating chamber and being fluidly connected with the gas source.

11. The electron beam vapor deposition apparatus as recited in claim 10, wherein the second chamber section is located between the pair of first chamber sections.

12. The electron beam vapor deposition apparatus as recited in claim 10, wherein the at least one first transport includes a plurality of first transports, and the at least one second transport includes a plurality of second transports.

13. The electron beam vapor deposition apparatus as recited in claim 10, wherein the coating chamber includes a plurality of valves operative to seal each of the pair of first chamber sections and the second chamber section.

14. The electron beam vapor deposition apparatus as recited in claim 10, wherein the plurality of first crucibles includes multiple pairs of first crucibles, with respective pairs of the multiples pair being adjacent to respective ones of the pair of first coating zones.

15. The electron beam vapor deposition apparatus as recited in claim 14, further comprising a divider wall between the first crucibles of at least one of the respective pairs.

16. The electron beam vapor deposition apparatus as recited in claim 10, wherein the second chamber section is located between the pair of first chamber sections, and the plurality of first crucibles are free of connection to any gas source operable to provide a carrier gas through the plurality of first crucibles, and the at least one second crucible is connected to a gas source that is operable to provide a carrier gas through the at least one second crucible.

17. The electron beam vapor deposition apparatus as recited in claim 16, wherein the pair of first chamber sections are located on opposed sides, respectively, of the second chamber section.

* * * * *